US008933432B2

(12) United States Patent
Ishizaki

(10) Patent No.: US 8,933,432 B2
(45) Date of Patent: Jan. 13, 2015

(54) LIGHT-EMITTING DEVICE

(75) Inventor: Junya Ishizaki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 37 days.

(21) Appl. No.: 13/976,756

(22) PCT Filed: Dec. 9, 2011

(86) PCT No.: PCT/JP2011/006879
§ 371 (c)(1),
(2), (4) Date: Jun. 27, 2013

(87) PCT Pub. No.: WO2012/090400
PCT Pub. Date: Jul. 5, 2012

(65) Prior Publication Data
US 2013/0270520 A1    Oct. 17, 2013

(30) Foreign Application Priority Data
Dec. 28, 2010  (JP) .................................. 2010-292808

(51) Int. Cl.
*H01L 29/06*    (2006.01)
*H01L 31/00*    (2006.01)
(Continued)

(52) U.S. Cl.
CPC .............. *H01L 33/145* (2013.01); *H01L 33/06* (2013.01); *H01L 33/30* (2013.01)
USPC ......................... 257/13; 257/76; 257/E33.005

(58) Field of Classification Search
None
See application file for complete search history.

(56) References Cited

U.S. PATENT DOCUMENTS

| 4,860,297 A | 8/1989 | Hayakawa et al. |
| 7,723,731 B2 | 5/2010 | Konno et al. |

(Continued)

FOREIGN PATENT DOCUMENTS

| JP | A-63-153887 | 6/1988 |
| JP | A-5-275809 | 10/1993 |

(Continued)

OTHER PUBLICATIONS

Gardner et al., "1.4x efficiency improvement in transparent-substrate $(Al_xGa_{1-x})_{0.5}In_{0.5}P$ light-emitting diodes with thin (≤ 2000 A) active regions," *Applied Physics Letters*, vol. 74, No. 15, pp. 2230-2232, Apr. 12, 1999.

(Continued)

*Primary Examiner* — Sonya D McCall Shepard
(74) *Attorney, Agent, or Firm* — Oliff PLC

(57) ABSTRACT

The present invention provides a light-emitting device manufactured with use of a compound semiconductor substrate comprising at least: a p-type cladding layer; a multiple-active layer portion in which three or more active layers made of $(Al_xGa_{1-x})_yIn_{1-y}P$ (0≤x≤0.6, 0.4≤y≤0.6) and two or more barrier layers having a higher Al content rate x than the active layers are alternately laminated; and an n-type cladding layer, wherein the barrier layer on a side close to the p-type cladding layer has a smaller band gap than that of the barrier layer on a side close to the n-type cladding layer in the barrier layers, and the compound semiconductor substrate has a superlattice barrier layer between the multiple-active layer portion and the n-type cladding layer or in the n-type cladding layer. As a result, the light-emitting device having long life duration, low resistance, and high light-emitting efficiency (especially internal quantum efficiency) can be provided.

8 Claims, 10 Drawing Sheets

(51) Int. Cl.
*H01L 33/14* (2010.01)
*H01L 33/06* (2010.01)
*H01L 33/30* (2010.01)

(56) References Cited

U.S. PATENT DOCUMENTS

2008/0237569 A1 10/2008 Nago et al.
2010/0044674 A1 2/2010 Kim

FOREIGN PATENT DOCUMENTS

| | | |
|---|---|---|
| JP | A-06-283822 | 10/1994 |
| JP | A-06-283825 | 10/1994 |
| JP | A-06-310813 | 11/1994 |
| JP | A-6-326406 | 11/1994 |
| JP | A-08-088404 | 4/1996 |
| JP | A-11-251687 | 9/1999 |
| JP | A-2003-046200 | 2/2003 |
| JP | A-2006-032837 | 2/2006 |
| JP | A-2008-103534 | 5/2008 |
| JP | A-2008-243904 | 10/2008 |
| JP | A-2010-087270 | 4/2010 |
| JP | A-2010-153496 | 7/2010 |
| JP | A-2010-171272 | 8/2010 |
| WO | WO 2010/021457 A2 | 2/2010 |

OTHER PUBLICATIONS

Japanese Office Action issued in Application No. 2010-292808; Dated Jun. 18, 2013 (With Translation).
International Search Report issued in Application No. PCT/JP2011/006879; Dated Jan. 24, 2012 (With Translation).
Japanese Office Action issued in Japanese Patent Application No. 2010-292808 on Mar. 25, 2014 (with partial translation).

LIGHT-EMITTING DEVICE

BACKGROUND OF THE INVENTION

1. Field of the Invention

The present invention relates to a colored light-emitting device which can serve as an illumination or a light source for an indicator, and more particularly to a light-emitting device having multiple active layers.

2. Description of the Related Art

Since a light-emitting device having AlGaInP as a light-emitting layer is at least one digit brighter than a conventional colored light-emitting device, demands in use applications different from a conventional light-emitting diode, e.g., an in-car illumination or an LCD backlight are expanding. Although a fact that AlGaInP is of a direct transition type also contributes to an increase in intensity, enhancement of external quantum efficiency by providing a transparent and thick window layer is also a factor of the increase in intensity.

On the other hand, for example, Non-patent Literature 1 discloses that internal quantum efficiency is enhanced by providing a thick transparent conductive layer to a substrate and a window layer and also providing a multiple quantum well (MQW), thereby improving light-emitting efficiency.

In an AlGaInP-based light-emitting device, AlGaAs or GaP is used for a window layer. An AlGaAs layer has a problem in characteristics that it is degraded with respect to moisture, and GaP is generally used. However, to provide a thick GaP layer, a GaP substrate must be directly bonded to the AlGaInP light-emitting layer, or a thick film of GaP must be subjected to crystal growth. According to a method for directly bonding the GaP substrate, for example, as disclosed in Patent Literature 1, a barrier layer may be disadvantageously produced at a bonding interface with respect to the GaP substrate, and a long-time and high-temperature heat treatment is required to avoid this problem.

Further, although providing the window layer on one surface of the light-emitting layer is effective for improvement in light-emitting efficiency, it has been known that also providing the window layer on the other surface, i.e., providing it on both upper and lower surfaces of the light-emitting layer results in further improvement in external quantum efficiency. In this case, the window layer provided on the other surface is also formed by bonding or crystal growth, since a GaAs substrate functions as a light absorption layer, the substrate must be removed before forming the window layer.

A layer structure made of an AlGaInP-based material required for the light-emitting device is generally formed on a GaAs substrate by a MOVPE method. A total film thickness is no more than approximately 10 µm. Although an AlGaInP-based material and a GaAs-based material are lattice matching materials, a selective etching method can be used for these materials, and hence appropriately inserting a layer required for the selective etching between the GaAs substrate and an AlGaInP layer enables removing the GaAs substrate with etching.

However, a total film thickness of the AlGaInP-based material required for forming a functional layer which is necessary for light emission is approximately 10 µm at most and, if the GaAs substrate is removed and the AlGaInP layer alone remains, a film thickness of a remaining wafer is approximately 10 µm. Although the wafer having a film thickness of approximately 10 µm can be experimentally handled, it can be easily broken and does not have mechanical strength required to pass through an industrial process.

Therefore, a method by which strength holding plate (or a wafer) configured to hold mechanical strength is bonded to an AlGaInP growth surface side before removing a GaAs substrate and then the GaAs substrate is removed, is also considered. In this case, after a GaP substrate is bonded to a surface side from which the GaAs substrate has been removed, the strength holding plate (or the wafer) must be delaminated (removed), thereby cleaning is required along with the delamination, or there is a concern about contamination, costs are industrially increased, and there are not many merits. Therefore, to pass a wafer through an industrial process while saving costs, a method for providing the wafer with the mechanical strength by subjecting a thick GaP layer to crystal growth before removing the GaAs substrate is rational since the GaP layer portion can function as both a light extraction layer and the strength holding plate.

In case of subjecting the thick GaP layer to crystal growth in this manner, a thickness required for providing the mechanical strength sufficient to pass through the industrial process is not lower than 20 µm. To form a GaP layer having a film thickness of not smaller than 20 µm by crustal growth, several to ten-odd hours are required. Since the external quantum efficiency is enhanced as the film thickness of the GaP layer is increased, a long growth time is required. Furthermore, as a temperature required for growth of the GaP layer, a high temperature equal to or higher than a temperature necessary for growth of the AlGaInP layer is generally required, and the AlGaInP light-emitting layer portion is exposed to a temperature at the time of MOVPE growth or a temperature that is higher than the temperature of MOVPE growth for a long time.

A p-conductivity type cladding layer is doped with p-type impurities such as Mg or Zn, these impurities are heated at the time of the above-described crystal growth, thereby they diffuse based on thermal dynamics, and they may also possibly diffuse in a active layer. Since the p-type impurities that have diffused in the active layer are apt to form a defect, a defect is formed during a device life test by energization or the like, a reduction in carrier injection efficiency or an increase in light absorption thereby occurs, and an optical output reduction phenomenon is caused during the device life test.

The diffusion of the p-type impurities is largely dependent on Al composition x in $(Al_xGa_{1-x})_yIn_{1-y}P$, the impurities rapidly diffuse if a mount of the Al composition x is small, and hence the impurities hardly stay. For example, the active layer contains less Al composition x, an impurity diffusion speed in the active layer is relatively higher than that in the cladding layer having a large amount of Al composition x, and the impurities hardly stay. Although impurity concentration varies depending on impurity concentration in an adjacent layer, the layer adjacent to the active layer requires the cladding layer for carrier confinement, and the cladding layer is generally doped. Since the cladding layer requires a wider band gap than that of the active layer, an amount of Al composition x is large, and thereby the impurity diffusion speed is lower than that in the active layer. Moreover, to prevent the injection efficiency with respect to the active layer from lowering, the cladding layer must hold the impurities whose concentration is not lower than a given level. Therefore, the impurities present in the cladding layer diffuse into the active layer.

If the active layer has a thickness more than a certain extent even though the impurities diffuse, a photo-activating portion can be designed with impurity concentration lower than impurity concentration that causes an influence of the impurity diffusion. For example, when a portion where a defect is formed due to the impurity diffusion to the active layer has a thickness of approximately 50 nm and an effective active layer film thickness required for radiative recombination is approximately 500 nm, providing a homogeneous active layer having a thickness of approximately 550 nm and a uniform combination enables maintaining the radiative recombination in the active layer even though impurities diffuse. However, this impurity diffusion contaminated layer having the thickness of approximately 50 nm is a layer having non-radiative recombination higher than that in any other active layer, and this layer can be a cause of a reduction in luminous efficacy. This type of active layer will be referred to as a bulk type active layer for the convenience's sake.

As described above, although the bulk type active layer is an active layer that is advantageous to suppression of an influence of the impurity diffusion, only the carrier confinement effect sandwiched between p-type and n-type cladding layers can be expected, a region contaminated with the impurities has a function as a non-radiative recombination layer, and hence the luminous efficacy is hardly improved. The bulk type active layer has internal quantum efficiency of approximately 60% at most, and the internal quantum efficiency is required to be enhanced.

As a method for enhancing the internal quantum efficiency, for example, as disclosed in Patent Literature 2 or the like, there is a method using a multiple quantum well (MQW) structure. When the MQW structure is adopted, the luminous efficacy can be improved by the confinement effect relative to a quantum well. However, since a thickness of each layer in the MQW is close to a de Broglie wavelength of an electron in a semiconductor, i.e., several to more than 10 nm, a thickness of each layer is very smaller than that of the bulk active layer. Therefore, as described above, an influence of the impurity diffusion to the active layer becomes considerable. This problem may be possibly solved by increasing the number of active layers in the MQW, but the number must be greatly increased, and the internal quantum efficiency is lowered due to self-absorption of the active layers.

Additionally, there is also a method, which is similar to the MQW, for setting each layer to a film thickness that is equal to or higher than the de Broglie wavelength and enhancing the luminous efficacy with the smaller number of layers. In this case, since the impurity diffusion is appropriately controlled, a problem hardly occurs during a device life test, and a light-emitting device with long life duration can be fabricated.

Even in a material other than the AlGaInP-based material Mg diffusion suppressing effect is shown by sandwiching a layer having a different composition, and this effect can be found in Patent Literature 3 and others.

However, when a film thickness equal to or higher than the de Broglie wavelength is adopted, since tunneling does not occur in a barrier layer provided between active layers, carrier transport from the active layer to another adjacent active layer has nothing to depend on except pumping. Since an electron has a small effective mass, the pumping is relatively easy, an effective mass of an electron hole is greatly larger than that of an electron, a statistical probability of the pumping that exceeds the high barrier layer is lower than an that of an electron, and hence the carrier injection efficiency in the active layer and the luminous efficacy are decreased in especially a low-current region with a small number of carriers. Additionally, a series resistance component is increased due to a reduction in carrier injection efficiency. This effect can be a serious problem in a device to be used in a low-current region like a light-emitting diode. However, a state that the pumping of carries hardly occurs means that the carrier confinement effect is improved, and the luminous efficacy is increased by effect of carries confined in the active layer.

The same effect as the above description that the series resistance component is increased by inserting a layer made of material with a wider band gap than that of the active layer is disclosed in, e.g., Patent Literature 4.

As a method for solving the above-described problem, in a configuration that thick transparent layers are provided on upper and lower sides of the light-emitting layer and an active layer and a barrier layer are alternately laminated, as disclosed in Patent Literature 5, a band gap of the barrier layer on a p-type side is decreased to reduce a VF (a forward voltage), and thereby a light-emitting device having high luminance and long life duration can be obtained. However, it is insufficient to solve a problem of a reduction in luminance and others, and a device with higher quality has been demanded.

Patent Literature 1: Japanese Unexamined Patent Application Publication No. 2006-32837
Patent Literature 2: Japanese Unexamined Patent Application Publication No. 2003-46200
Patent Literature 3: Japanese Unexamined Patent Application Publication No. Hei 06-283825
Patent Literature 4: Japanese Unexamined Patent Application Publication No. Hei 11-251687
Patent Literature 5: Japanese Unexamined Patent Application Publication No. 2010-087270
Patent Literature 6: Japanese Unexamined Patent Application Publication No. Hei 06-283822
Patent Literature 7: Japanese Unexamined Patent Application Publication No. Hei 06-310813
Patent Literature 8: Japanese Unexamined Patent Application Publication No. Hei 08-088404
Non-patent Literature 1: Applied Physics Letters Vol. 74 No. 15 pp. 2230-2232

SUMMARY OF THE INVENTION

The configuration having the transparent films each having a large film thickness provided on the upper and lower sides of the active layer portion is a configuration that attaches a high value on light extraction from a lateral direction of a device rather than a vertical direction of the device. In this type of device, in case of reducing costs, decreasing a cross-sectional area of the device is effective, this means that a cross-sectional area in a current flowing direction is decreased, and the above-described configuration is a configuration that is suitable for a device in which a small current flows rather than a device in which a large current flows.

However, since a bias difference is not large under such small-current conditions, a phenomenon that a first conductivity type carrier returns from a first conductivity type active layer to a cladding layer is a problem rather than an overflow phenomenon that the first conductivity type carrier injected into the active layer reaches a doped layer which is of a second conductivity type. Since the carrier cannot sufficiently stay in the active layer due to occurrence of the phenomenon, a problem of a reduction in luminance arises.

As means for suppressing the overflow, there is known a method for providing a superlattice barrier on a p-type side rather than an active layer as disclosed in, e.g., Patent Literatures 6 and 7. However, these literatures are a countermeasure for the overflow of an n-type carrier from an active layer to a p-conductivity type layer, and it is restricted to a situation where current density of the active layer is large and an application voltage is high.

However, under small-current conditions, a large voltage that allows the n-type carrier to overflow to the p-conductivity type layer is not applied, and the current density of the carrier in the active layer is not high. Therefore, the problem of the overflow in the device configuration used under the small-current conditions cannot be solved.

Further, in Patent Literature 8, although the superlattice barrier layer is provided on the n-type cladding layer side, the active layer has a simple MQW configuration, and a device having long life duration cannot be provided.

In view of the above-described problem, it is an object of the present invention to provide a light-emitting device which has long life duration and low resistance and holds high luminous efficacy (especially internal quantum efficiency).

To achieve the object, according to the present invention, there is provided a light-emitting device manufactured with use of a compound semiconductor substrate comprising at least: a p-type cladding layer; a multiple-active layer portion in which three or more active layers made of $(Al_xGa_{1-x})_yIn_{1-y}P$ ($0 \leq x \leq 0.6$, $0.4 \leq y \leq 0.6$) and two or more barrier layers having a higher Al content rate x than the active layers are alternately laminated; and an n-type cladding layer, wherein the barrier layer on a side close to the p-type cladding layer has a smaller band gap than that of the barrier layer on a side close to the n-type cladding layer in the barrier layers, and the compound semiconductor substrate has a superlattice barrier layer between the multiple-active layer portion and the n-type cladding layer or in the n-type cladding layer.

As described above, as to the barrier layers, when the barrier layer on the side close to the p-type cladding layer has a smaller band gap than the barrier layer on the side close to the n-type cladding layer, a hopping probability of the p-type carrier in the barrier layers can be increased. As a result, both the n-type and the p-type carriers can be homogeneously distributed in the active layers, the series resistance can be reduced, and the internal quantum efficiency can be also improved. Further, when the superlattice barrier layer is provided between the multiple-active layer portion and the n-type cladding layer or in the n-type cladding layer, the overflow of the carrier can be suppressed, and a reduction in luminance can be avoided. Furthermore, since the multiple-active layer configuration is adopted, an influence of impurity diffusion can be reduced, and the long life duration can be realized. Moreover, when the superlattice barrier layer is provided in the n-type cladding layer, since carrier traps due to ionized impurities do not have to be considered, it is possible to provide a light-emitting device having a high degree of design freedom such as doping concentration in the superlattice barrier layer.

As described above, according to the present invention, the light-emitting device having the long life duration, the low resistance, and the high luminous efficacy can be provided.

At this time, it is preferable for the superlattice barrier layer to be made of $(Al_xGa_{1-x})_yIn_{1-y}P$ ($0 \leq x \leq 1$, $0.4 \leq y \leq 0.6$) and/or $Al_zGa_{1-z}As$ ($0 \leq z \leq 1$) and obtained by alternately laminating sublayers having different band gaps such that one of the sublayers has a different band gap from that of a sublayer adjacent to the one of the sublayers.

If such a superlattice barrier layer is used, the light-emitting device that effectively suppresses the overflow of the carrier can be provided.

At this time, it is preferable for the superlattice barrier layer to be obtained by alternately laminating sublayers having different band gaps and having thicknesses of 15 nm or less such that one of the sublayers has a different band gap from that of a sublayer adjacent to the one of the sublayers.

If such a superlattice barrier layer is used, a large barrier can be assured, and the light-emitting device that can securely suppress the overflow of the carrier can be provided.

At this time, the superlattice barrier layer can be formed so as to be adjacent to the multiple-active layer portion.

The superlattice barrier layer according to the present invention can be formed to be adjacent to the multiple-active layer portion in this manner.

As described above, according to the present invention, in the light-emitting device which involves growth of, e.g., a GaP thick film, it is possible to provide the light-emitting device which can achieve both the long life duration and the high luminous efficacy (especially internal quantum efficiency) of a multiple-active layer type light-emitting device.

DETAILED DESCRIPTION OF THE PREFERRED EMBODIMENTS

Although an embodiment of the present invention will now be described hereinafter in detail with reference to the drawings, the present invention is not restricted thereto.

Figure 1:
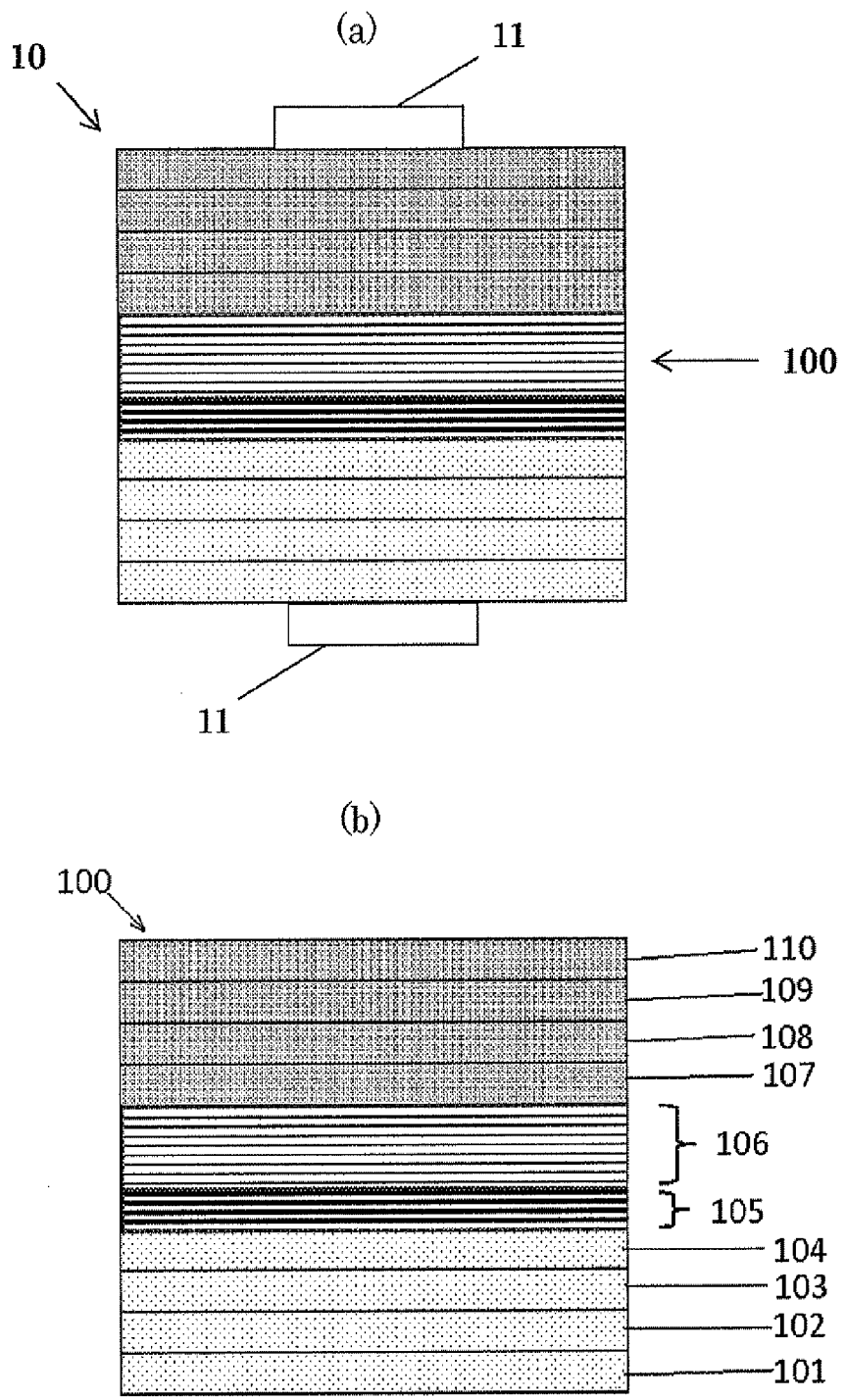
FIG. 1 is a schematic view showing an example of (a) a light-emitting device according to a first embodiment of the present invention and (b) a compound semiconductor substrate for use in manufacture of the light-emitting device.
Figure 2:
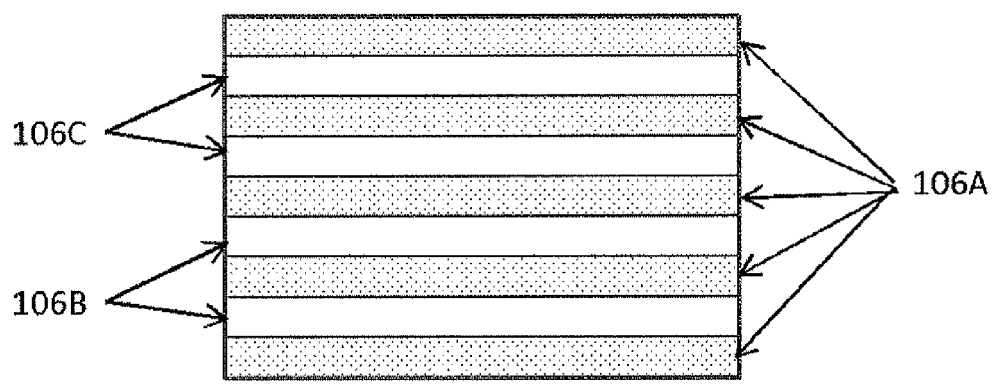
FIG. 2 is a schematic view showing an example of a multiple-active layer portion of the compound semiconductor substrate for use in manufacture of the light-emitting device according to the first embodiment of the present invention.

FIG. 1 is a schematic view showing (a) a light-emitting device according to a first embodiment of the present invention and (b) a compound semiconductor substrate used in this device. FIG. 2 is a schematic view showing a multiple-active layer portion.

As shown in FIG. 1(a), a light-emitting device 10 according to the present invention is constituted of e.g., a compound semiconductor substrate 100 and electrodes 11 formed on surfaces thereof. The light-emitting device 10 is obtained by forming the electrodes 11 on a p-type surface and an n-type surface of the compound semiconductor substrate 100 described below and dicing this substrate into a dice shape.

As shown in FIG. 1(b) and FIG. 2, the compound semiconductor substrate 100 for use in manufacture of the light-emitting device 10 according to the first embodiment of the present invention comprises: a p-type cladding layer 107; a multiple-active layer portion 106 in which three or more active layers 106A made of $(Al_xGa_{1-x})_yIn_{1-y}P$ ($0 \leq x \leq 0.6$, $0.4 \leq y \leq 0.6$) and two or more barrier layers 106E and 106C each having a higher Al content rate than the active layer 106A are alternately laminated; and an n-type cladding layer 104.

Further, in regard to the barrier layers, each barrier layer 106C on the side close to the p-type cladding layer 107 has a smaller band gap than each barrier layer 106B on the side close to the n-type cladding layer 104, and the compound semiconductor substrate 100 has a superlattice barrier layer 105 between the multiple-active layer portion 106 and the re-type cladding layer 104.

When the multiple-active layer portion 106 is provided in this manner, an influence of impurity diffusion can be suppressed, and a device having long life duration can be provided. Furthermore, as different from provision of the superlattice barrier layer on the p-type cladding layer side in a configuration mainly focusing on a laser device having high current density, an LED or the like having low current density can effectively suppress overflow by providing the superlattice barrier layer 105 between the multiple-active layer portion 106 and the n-type cladding layer 104 on the opposite side.

Moreover, when the superlattice barrier layer 105 is simply provided, a VF rises at a low temperature in particular. Therefore, as to the barrier layers 106b and 106C in the multiple-active layer portion 106, the barrier layers 106C are made of a material having a narrower band gap than that of the barrier layers 106B. When such inhomogeneous barrier layers are provided, a hopping probability of a p-type carrier in the barrier layers can be increased, and a stay probability of the p-type carrier near a p/n junction can be increased. Therefore, both the n-type and the p-type carriers can be uniformly distributed in the active layers, and the VF can be effectively reduced.

As the compound semiconductor substrate 100 for use in manufacture of the light-emitting device 10 according to the present invention, for example, it is possible to provide an n-type GaP substrate 101 (a thickness: 30 to 150 μm, doping concentration: $5 \times 10^{17}/cm^3$ to $5 \times 10^{18}/cm^3$) as a first layer portion, an n-type InGaP buffer layer 102 (a thickness: 10 to 100 nm, ($0.5 < x < 0.9$), doping concentration: $1 \times 10^{18}/cm^3$ to $1 \times 10^{19}/cm^3$) as a second layer portion, and an n-type AlGaInP layer 103 ($(Al_xGa_{1-x})_yIn_{1-y}P$ ($0.5 \leq x \leq 0.7$, $0.45 \leq y \leq 0.55$), a thickness: 0.1 to 1.5 μm, doping concentration: $1 \times 10^{17}/cm^3$ to $1 \times 10^{18}/cm^3$) as a third layer portion.

Moreover, in a fourth layer portion, as the n-type cladding layer 104, for example, an n-type AlGaInP layer ($(Al_xGa_{1-x})_yIn_{1-y}P$ ($0.6 \leq x \leq 1$, $0.45 \leq y \leq 0.55$), a thickness: 0.5 to 1.5 μm, doping concentration: $1 \times 10^{17}/cm^3$ to $1 \times 10^{18}/cm^3$) can be provided.

Additionally, in a seventh layer portion, as the p-type cladding layer 107, for example, a p-type AlGaInP layer ($(Al_xGa_{1-x})_yIn_{1-y}P$ ($0.5 \leq x \leq 0.7$, $0.45 \leq y \leq 0.55$), a thickness: 0.1 to 1.5 μm, doping concentration: $5 \times 10^{15}/cm^3$ to $1 \times 10^{18}/cm^3$) can be provided.

Further, it is possible to provide a p-type AlGaInP layer 108 ($(Al_xGa_{1-x})_yIn_{1-y}P$ ($0.5 \leq x \leq 1$, $0.45 \leq y \leq 0.55$), a thickness: 0.1 to 1.5 μm, doping concentration: $5 \times 10^{16}/cm^3$ to $3 \times 10^{18}/cm^3$) as an eighth layer portion, a p-type InGaP buffer layer 109 ($Ga_yIn_{1-y}P$ ($0.45 \leq y < 1$), a thickness: 0.001 to 0.5 μm, doping concentration: $3 \times 10^{17}/cm^3$ to $3 \times 10^{19}/cm^3$) as a ninth layer portion, and a p-type GaP window layer 110 (a thickness: 30 to 150 μm, doping concentration: $5 \times 10^{17}/cm^3$ to $5 \times 10^{18}/cm^3$) as a 10th layer portion.

Figure 3:
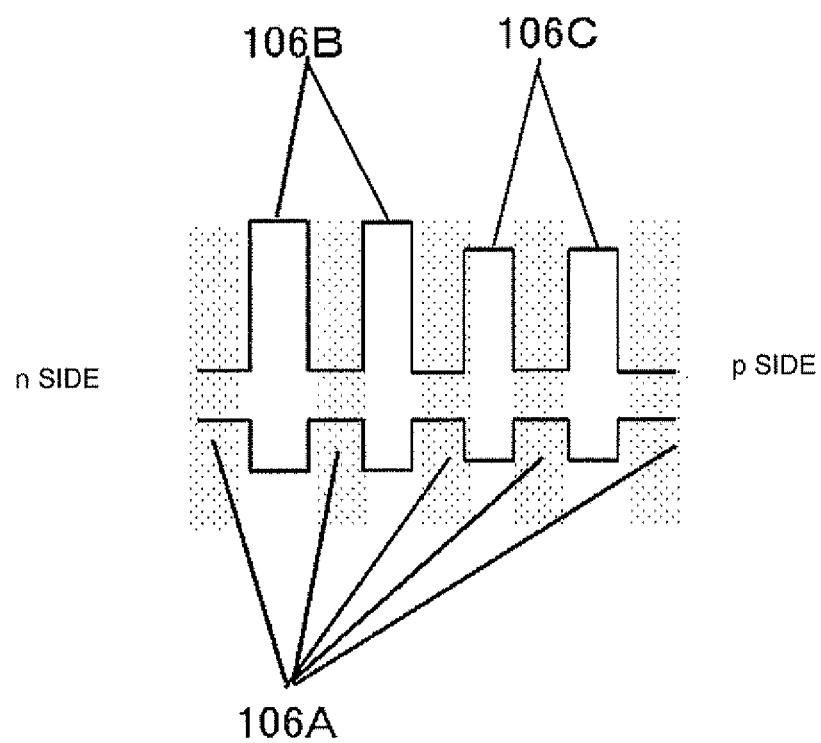
FIG. 3 is a view showing a band lineup of the multiple-active layer portion of the compound semiconductor substrate for use in manufacture of the light-emitting device according to the first embodiment of the present invention.

Furthermore, a multiple-active layer portion 106 as a sixth layer portion which is shown in FIG. 2 is constituted of three or more active layers 106A and two or more barrier layers 106B and 106C which are provided between the active layers 106A and have larger band gaps than the active layers 106A as shown in FIG. 3. The active layers 106A and the barrier layers 106B and 106C are alternately laminated, and they are provided in such a manner that each active layer 106A is adjacent to the p-type cladding layer 107 and the superlattice barrier layer 105. It is to be noted that FIG. 3 shows a band lineup of the multiple-active layer portion.

Moreover, in the present invention, when a composition of the barrier layer 106B is $Al_{0.85}GaInP$ and a composition of the barrier layer 106C is $Al_{0.60}GaInP$, the barrier layers 106C on the side close to the p-type cladding layer 107 can have a smaller band gap than the barrier layers 106E on the side close to the n-type cladding layer 104 as shown in FIG. 3.

In the configuration of the multiple-active layer portion 106, as a film thickness of each of the active layers 106A and the barrier layers 106B and 106C, a thickness of 15 to 150 nm is preferable.

For example, at the time of forming the n-type GaP substrate 101 or the p-type GaP window layer 110, a temperature and a time which are above values required for growth of the layer 102 to the layer 109 are required. If a thickness of each layer in the multiple-active layer portion 106 is not smaller than 15 nm, a p-type dopant can be prevented from diffusing in the active layers and optical life duration characteristics can be prevented from being deteriorated even though it is exposed to high thermal energy at the time of forming the n-type GaP substrate or the p-type GaP window layer 110. Additionally, if the thickness is not greater than 150 nm, light absorption of the active layers 106A themselves can be reduced, and a drop in optical output can be prevented.

In case of configuring such barrier layers 106B and 106C with a film thickness that is not smaller than 10 nm, there is a problem of an increase in VF in conventional examples. A cause of the increase in VF is the p-type carrier having a large effective mass, and this increase occurs since the carrier can hardly get over each barrier layer 106C. However, like the present invention, when each barrier layer 106C on the side close to the p-type cladding layer 107 has the smaller band gap than each barrier layer 106B on the side close to the n-type cladding layer 104, such an increase in VF can be effectively suppressed.

Further, the multiple-active layer portion 106 does not have to be actively doped, but the p-type dopant is diffused and present in a process of forming the n-type GaP substrate 101 or the p-type GaP window layer 110, and hence Mg or Zn of the p-type dopant may be present with concentration of $1 \times 10^{17}/cm^3$ or below.

Figure 4:
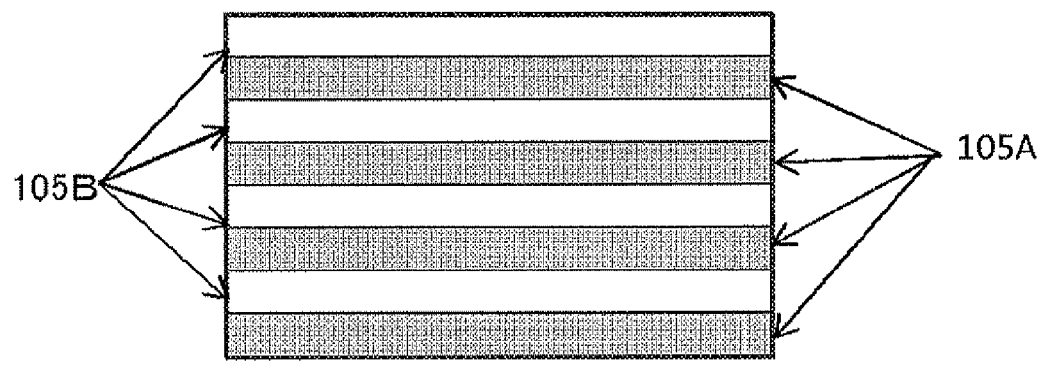
FIG. 4 is a schematic view showing an example of a superlattice barrier layer of the compound semiconductor substrate for use in manufacture of the light-emitting device according to the first embodiment of the present invention.
Figure 5:
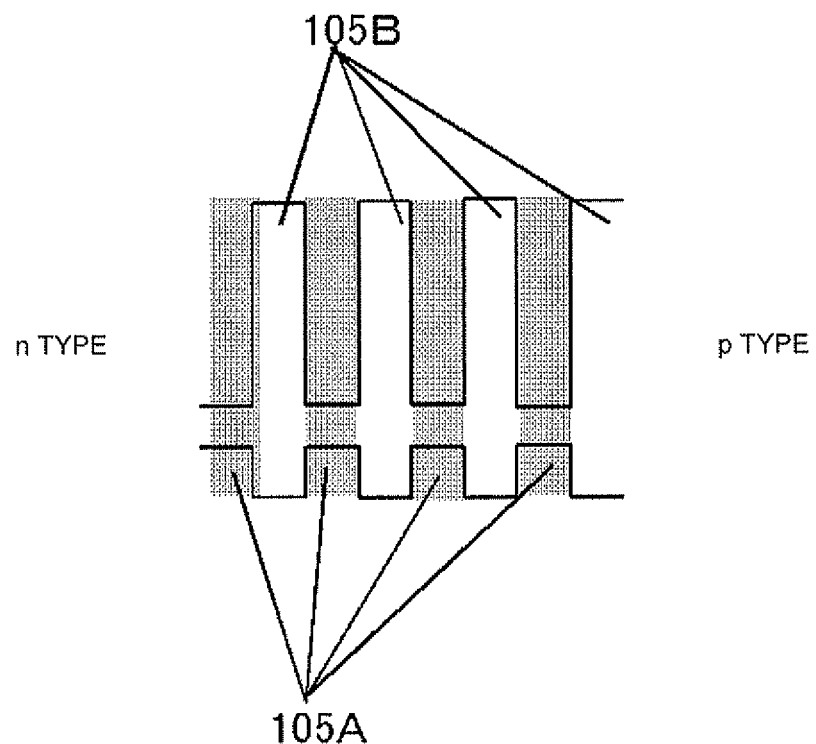
FIG. 5 is a view showing a band lineup of the superlattice barrier layer of the compound semiconductor substrate for use in manufacture of the light-emitting device according to the first embodiment of the present invention.

In the present invention, for example, as shown in FIG. 4, the superlattice barrier layer 105 as the fifth layer portion can be made of $(Al_xGa_{1-x})_yIn_{1-y}P$ ($0 \leq x \leq 1$, $0.4 \leq y \leq 0.6$) and/or $Al_zGa_{1-z}As$ ($0 \leq z \leq 1$) and can have layers 105A and 105B having different band gaps alternately laminated. In this case, as shown in FIG. 5, the band gap of one layer 105A in the superlattice barrier layer 105 can be smaller than that of the other layer 105B in the superlattice barrier layer 105. It is to be noted that FIG. 4 is a schematic view showing the superlattice barrier layer, and FIG. 5 shows a band lineup of the superlattice barrier layer.

At this time, it is preferable that the superlattice barrier layer 105 is obtained by alternately laminating sublayers having different band gaps and a thickness of 15 nm or less.

Each film thickness of the sublayers is set to 15 nm or less in order to form a mini-band by creation of a superlattice. The superlattice barrier layer 105 having an alternate lamination structure formed with sublayers having a film thickness that is not greater than a de Broglie wavelength of 15 nm has a larger band gap than a minimum band gap of a constituent material by forming the mini-band. Therefore, when the film thickness of 15 nm or less is provided, a band gap equal to or larger than that of the constituent material can be designed.

Further, it is preferable that the band gap of the layer 105B is made of a material having a larger band gap than the n-type cladding layer 104.

In view of formation of the mini-band, the layer 105B can be made of a material having a smaller band gap than the n-type cladding layer 104. However, considering raising a barrier on the n-conductivity type side, it is more desirable for the band gap of the layer 105B to be made of a material of the band gap larger than the n-type cladding layer 104.

Further, it is desirable that the band gap of the layer 105A is equal to or above the band gap of the active layer 106A.

If such a band gap of the layer 105A is provided, a light absorption layer is hardly formed. Since such light absorption remarkably occurs when a film thickness is large in particular, if a film thickness of the layer 105A with the small band gap is substantially equal to that of the active layer 106A, an influence of the light absorption can be allowed, but it is not desirable in terms of design. Therefore, it is desirable that the layer 105A has a composition that can realize a band gap larger than that of the active layer 106A, especially a composition that can realize a band gap equal to or larger than that of the n-type cladding layer 104.

In this regard, for example, when the n-type cladding layer 104 is made of $Al_{0.85}GaInP$, AlInP is preferable for the layer 105B, and the layer 105A can be made of $Al_{0.85}GaInP$.

Moreover, it is preferable that doping concentration of the superlattice barrier layer 105 according to this embodiment is a value smaller than that of the n-type cladding layer 104, e.g., $1\times10^{16}/cm^3$ to $8\times10^{17}/cm^3$.

The above-described doping concentration can sufficiently reduce the ionized impurities near each active layer that can be a cause of carrier traps and decreases an output, and can prevent the carrier from being trapped in the superlattice barrier layer 105.

A second embodiment of the present invention will now be described. The second embodiment is different from the first embodiment in that a superlattice barrier layer is provided in an n-type cladding layer.

Figure 6:
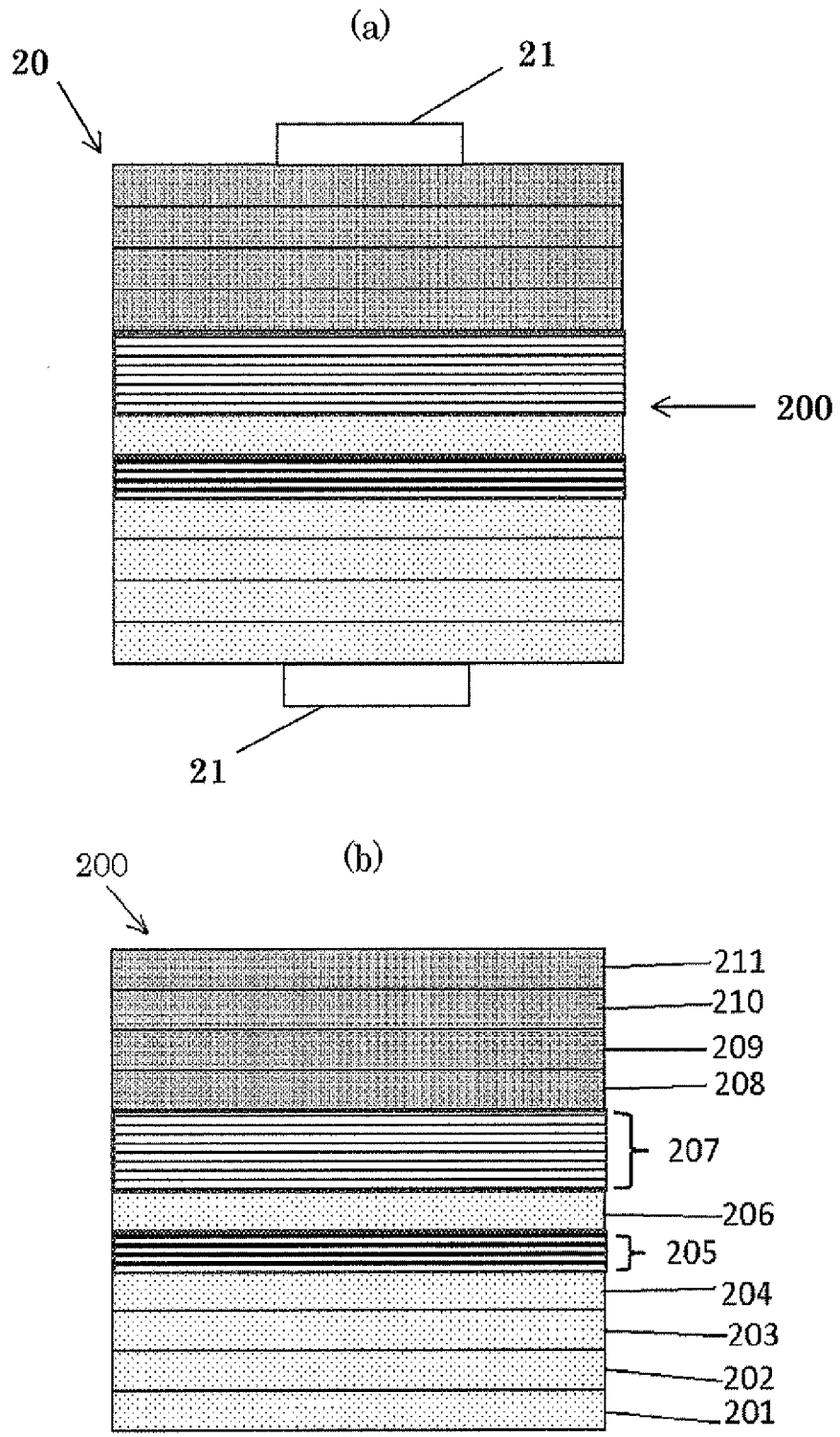
FIG. 6 is a schematic view showing an example of (a) a light-emitting device according to a second embodiment of the present invention and (b) a compound semiconductor substrate for use in manufacture of the light-emitting device.
Figure 7:
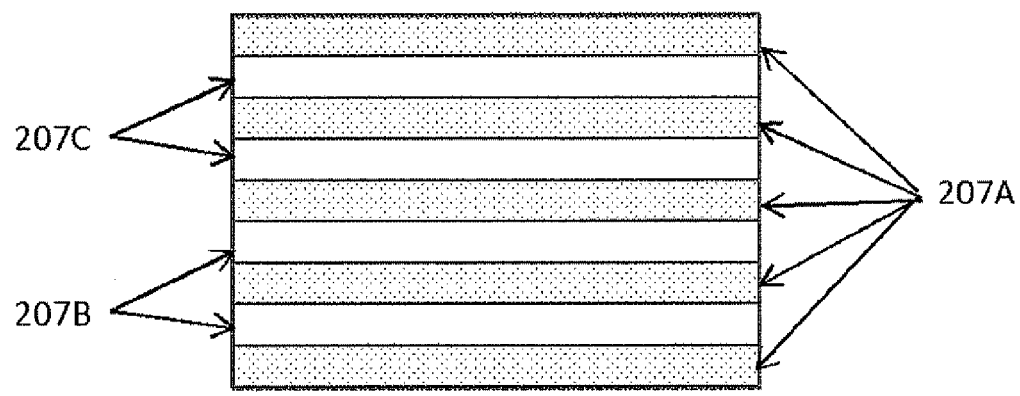
FIG. 7 is a schematic view showing an example of a multiple-active layer portion of the compound semiconductor substrate for use in manufacture of the light-emitting device according to the second embodiment of the present invention.
Figure 8:
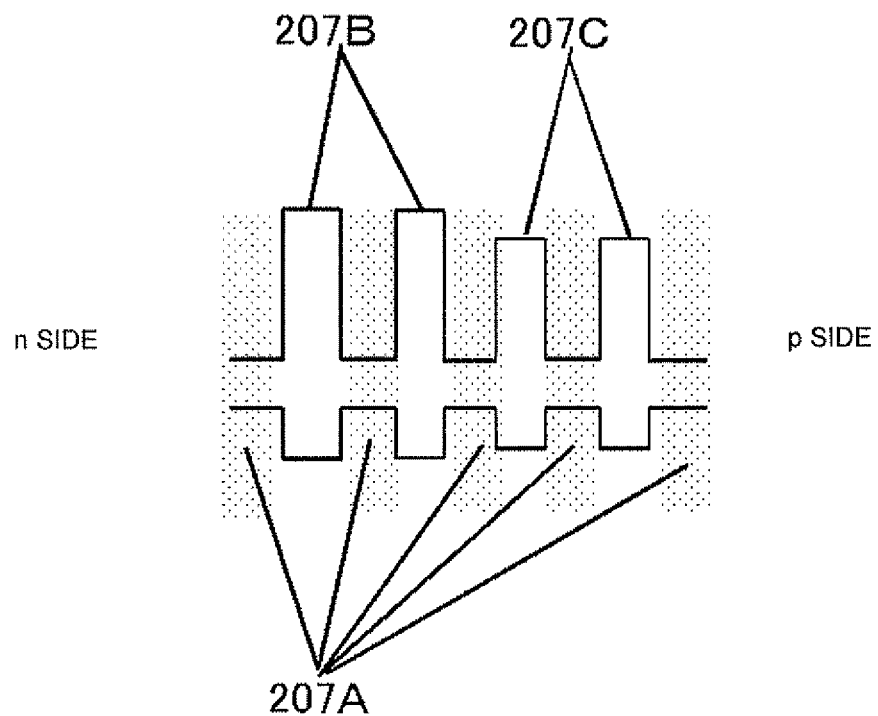
FIG. 8 is a view showing a band lineup of the multiple-active layer portion of the compound semiconductor substrate for use in manufacture of the light-emitting device according to the second embodiment of the present invention.
Figure 9:
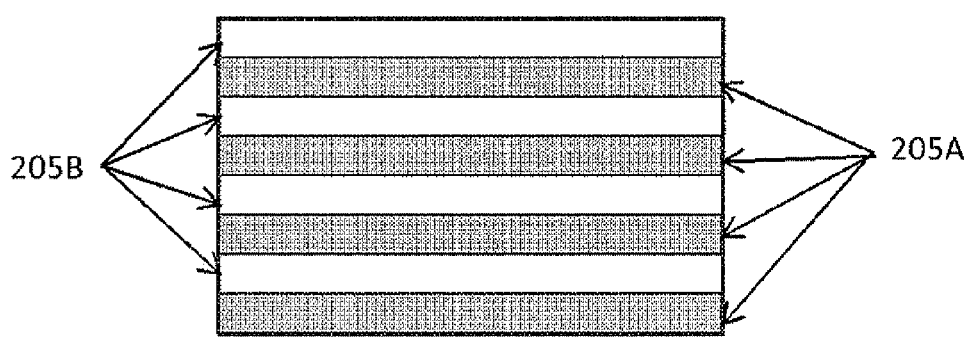
FIG. 9 is a schematic view showing an example of a superlattice barrier layer of the compound semiconductor substrate for use in manufacture of the light-emitting device according to the second embodiment of the present invention.
Figure 10:
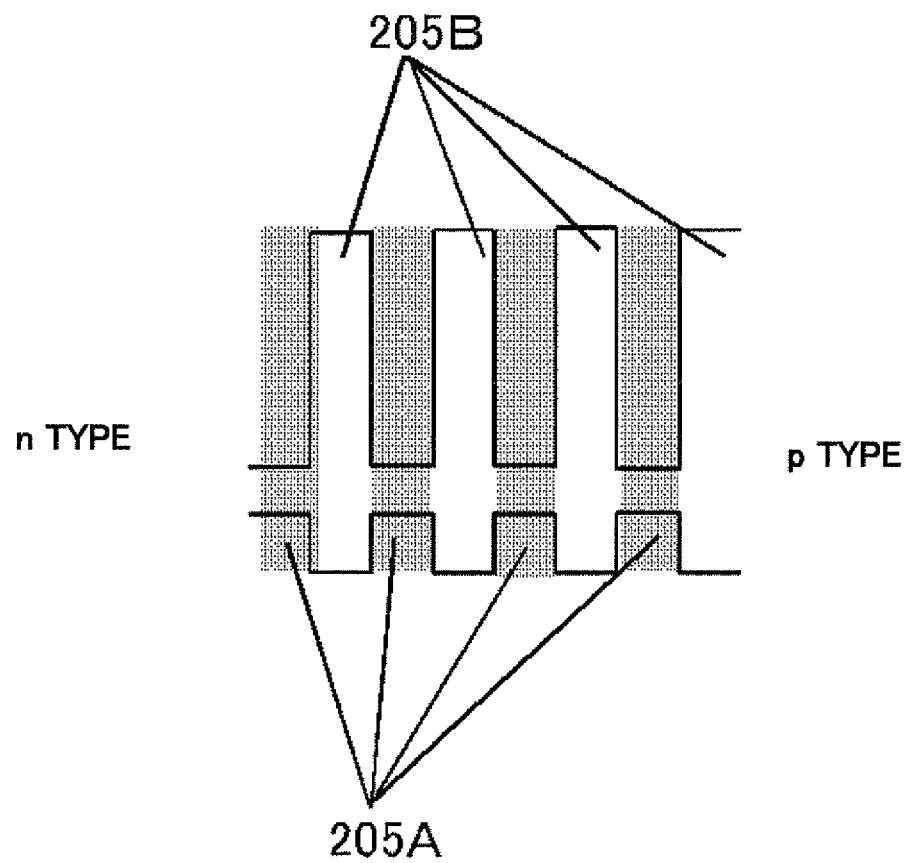
FIG. 10 is a view showing a band lineup of the superlattice barrier layer of the compound semiconductor substrate for use in manufacture of the light-emitting device according to the second embodiment of the present invention.

FIG. 6 is a schematic view showing (a) a light-emitting device according to the second embodiment and (b) a compound semiconductor substrate for use in manufacture of this device. FIG. 7 is a schematic view showing a multiple-active layer portion, and FIG. 8 shows a band lineup of the multiple-active layer portion. FIG. 9 is a schematic view showing a superlattice barrier layer, and FIG. 10 shows a band lineup of the superlattice barrier layer.

As shown in FIG. 6(a), a light-emitting device 20 according to the present invention comprises, e.g., a compound semiconductor substrate 200 and electrodes 21 formed on surfaces thereof.

Further, respective layers 201 to 204 and 208 to 211 including a p-type cladding layer 208 and an n-type cladding layer 204 in the compound semiconductor substrate 200 shown in FIG. 6(b) can be the same as the respective layers 101 to 104 and 107 to 110 in the compound semiconductor substrate 100 according to the first embodiment.

In the compound semiconductor substrate 200 shown in FIG. 6(b), active layers 207A and barrier layers 207B and 207C in a multiple-active layer portion 207 shown in FIG. 7 can be likewise the same as the active layers 106A and the barrier layers 106B and 106C in the multiple-active layer portion 106 according to the first embodiment.

Therefore, each barrier layer 207C on the side close to the p-type clad layer 208 is configured to have a smaller band gap than that of each barrier layer 207B on the side close to the n-type clad layer 204, whereby such a band lineup as shown in FIG. 8 can be provided. As a result, a VF can be reduced.

In the compound semiconductor substrate 200 shown in FIG. 6(b), layers 205A and 205B shown in FIG. 9 in a superlattice barrier layer 205 provided in the n-type cladding layers 204 and 206 can be likewise the same as the layers 105A and 105B in the superlattice barrier layer 105 according to the first embodiment, thus such a band lineup as shown in FIG. 10 can be provided. However, in the second embodiment, as will be described below, since the superlattice barrier layer 205 is provided in the n-type cladding layers 204 and 206, doping concentration of the superlattice barrier layer 205 can be set in a wider range.

In the second embodiment, the superlattice barrier layer 205 provided in the n-type cladding layers 204 and 206 can suppress the overflow.

Furthermore, in the second embodiment according to the present invention shown in FIG. 6(b), the compound semiconductor substrate 200 has the inner n-type cladding layer 206 provided between the multiple-active layer portion 207 and the superlattice barrier layer 205. As this n-type cladding layer 206, it is preferable to use, e.g., an n-type AlGaInP layer $((Al_xGa_{1-x})_yIn_{1-y}P$ ($0.6\leq x\leq 1$, $0.45\leq y\leq 0.55$), a thickness: 0.5 to 1.5 μm, doping concentration: $1\times10^{16}/cm^3$ to $5\times10^{17}/cm^3$) doped with lower concentration than that of the outer n-type cladding layer 204. In this case, the superlattice barrier layer 205 is provided near a boundary between a doping fixed layer and a doping reduced layer of the re-type cladding layers.

Since an influence of carrier traps due to ionized impurities does not have to taken into consideration by provision of such an inner n-type cladding layer 206, the doping concentration of the superlattice barrier layer 205 can be equal to that of the outer n-type cladding layer 204, and this concentration can be set to the range of $1\times10^{17}/cm^3$ to $5\times10^{18}/cm^3$.

Furthermore, when the n-type cladding layer 206 is a thin film having a thickness of 0.5 μm or less, in order to assuredly eliminate the influence of the ionized impurities, the doping concentration of the superlattice barrier layer 205 can be set to become smaller than that of the n-type cladding layer 204, or the doping concentration of the superlattice barrier layer 205 can be changed in a slanting or step-like pattern from an interface with respect to the n-type cladding layer 204 to an interface with respect to the n-type cladding layer 206.

Although a method for manufacturing such a light-emitting device according to the present invention is not restricted in particular, there is, e.g., the following method.

First, an n-type GaAs substrate is prepared as a single crystal substrate for growing a layer, and respective layers, e.g., an n-type InGaP buffer layer or the like, an n-type cladding layer, a superlattice barrier layer, a multiple-active layer portion, a p-type cladding layer, and others are subjected to vapor phase epitaxy on this GaAs substrate by the MOCVD method. Then, based on the HVPE method, a Zn doped p-type GaP window layer which is the outermost surface layer is subjected to the vapor phase epitaxy, and thereafter the GaAs substrate is removed. As a result, the n-type InGaP buffer layer is exposed.

Moreover, an n-type GaP substrate is bonded to the surface of the n-type InGaP buffer layer exposed by the removal of the GaAs substrate, or an n-type GaP layer is formed on the same surface by the vapor phase epitaxy using the HVPE method, whereby the compound semiconductor substrate can be obtained.

At the time of performing the vapor phase epitaxy by the MOCVD method or the HVPE method, general conditions can be used.

Electrodes are formed on the thus obtained compound semiconductor substrate, and this substrate is cut to process into a chip, thereby obtaining the light-emitting device according to the present invention.

EXAMPLES

Although the present invention will now be more specifically explained based on examples and a comparative example hereinafter, the present invention is not restricted thereto.

Examples 1 and 2

As Example 1, the light-emitting device 10 according to the first embodiment of the present invention shown in FIG. 1 was fabricated. Further, as Example 2, the light-emitting device 20 according to the second embodiment of the present invention shown in FIG. 6 was fabricated.

In each of Examples 1 and 2, a composition of the barrier layers 106E or 207B in the multiple-active layer portion 106 or 207 was $Al_{0.85}GaInP$, and a composition of the barrier layers 106C or 207C was $Al_{0.60}GaInP$. As a result, the band gap of the barrier layers on the side close to the p-type cladding layer was set smaller than that of the barrier layers on the side close to the n-type cladding layer.

Moreover, in each of Examples 1 and 2, each layer 105B or 205B was made of a material of a high-Al wide band gap layer (an AlInP layer) layer) low-Al narrow band gap layer ($Al_{0.85}GaInP$) with a film thickness of 15 nm, each layer 105A or 205A was made of a material of a low-Al narrow band gap layer ($Al_{0.85}GaInP$) with a film thickness of 15 nm, and the superlattice barrier layer 105 or 205 was formed by repeating an alternate lamination of these layers 20 times.

Characteristics evaluation of such light-emitting devices was carried out. Table 1 shows each voltage (a VF) required for allowing a current of 20 mA to flow and each optical output (PO).

Comparative Example

A light-emitting device was fabricated like Example 1 without providing the superlattice barrier layer 105.

Table 1 shows a result obtained by conducting the characteristics evaluation of such a light-emitting device.

TABLE 1

|  | VF@20 mA[V] | PO@20 mA[mW] |
| --- | --- | --- |
| Example 1 | 2.05 | 3.86 |
| Example 2 | 2.07 | 3.78 |
| Comparative Example | 2.04 | 3.48 |

As shown in Table 1, it was confirmed that there is no large difference between VF values at the time of energization using 20 mA in Comparative Example and Examples 1 and 2 and Examples 1 and 2 have increased optical outputs (PO).

It is to be noted that, although each layer in the superlattice barrier layer in Examples 1 and 2 has the film thickness of 15 nm, reducing the film thickness enables changing a sub-band forming level to a higher-energy side, and a large barrier can be assured. Since the sub-band can be appropriately designed with the film thicknesses of the low-Al narrow band gap layer and the high-Al wide band gap layer, it is needless to say that both the members do not have to have the same film thickness in essentials.

Examples 3 and 4

As Example 3, the light-emitting device 10 according to the first embodiment of the present invention shown in FIG. 1 was fabricated. Further, as Example 4, the light-emitting device 20 according to the second embodiment of the present invention shown in FIG. 6 was fabricated.

In each of Examples 3 and 4, a composition of the barrier layers 106B or 207B in the multiple-active layer portion 106 or 207 was $Al_{0.85}GaInP$, and a composition of the barrier layers 106C or 207C was $Al_{0.60}GaInP$. As a result, the band gap of the barrier layers on the side close to the p-type cladding layer was set smaller than that of the barrier layers on the side close to the n-type cladding layer.

Moreover, in each of Examples 3 and 4, each layer 105B or 205B was made of a material of a high-Al wide band gap layer (an AlInP layer) with a film thickness of 15 nm, each layer 105B or 205B was made of a material of a low-Al narrow band gap layer (a GaInP layer) with a film thickness of 15 nm, and the superlattice barrier layer 105 or 205 was formed by repeating an alternate lamination of these layers 20 times.

Table 2 shows a result obtained by conducting the characteristic evaluation of such light-emitting devices. The result of Comparative Example is also shown as reference.

TABLE 2

|  | VF@20 mA[V] | PO@20 mA[mW] |
| --- | --- | --- |
| Example 3 | 2.07 | 3.62 |
| Example 4 | 2.02 | 3.55 |
| Comparative Example | 2.04 | 3.48 |

Like Examples 1 and 2, it was confirmed that there is no large difference between VF values as compared with Comparative Example and Examples 3 and 4 have increased optical outputs (PO). However, increase levels of the optical outputs are lower than those in Examples 1 and 2. It can be considered that the increase levels are low because light absorption occurred in the GaInP layer portion having a smaller band gap than that of each active layer and allowed the optical outputs to fall below those in the Examples 1 and 2. However, the effect of the superlattice barrier layer is not deteriorated even though the light absorption occurs, and the optical outputs are higher that that in Comparative Example.

Examples 5 and 6

As Example 5, the light-emitting device 10 according to the first embodiment of the present invention shown in FIG. 1 was fabricated. Further, as Example 6, the light-emitting device 20 according to the second embodiment of the present invention shown in FIG. 6 was fabricated.

In each of Examples 5 and 6, a composition of the barrier layers 106B or 207B in the multiple-active layer portion 106 or 207 was $Al_{0.85}GaInP((Al_{0.85}Ga_{0.15})_{0.5}In_{0.5}P)$, and a composition of the barrier layers 106C or 207C was $Al_{0.60}GaInP$ $(Al_{0.60}Ga_{0.40})_{0.5}In_{0.5}P$. As a result, the band gap of the barrier layers on the side close to the p-type cladding layer was set smaller than that of the barrier layers on the side close to the n-type cladding layer.

Moreover, in each of Examples 5 and 6, each layer 105A or 205A was made of a material of a high-Al wide band gap layer (an AlInP layer) with a film thickness of 15 nm, each layer 105E or 205B was made of a material of a low-Al narrow band gap layer ($Al_{0.3}Ga_{0.7}As$ layer) with a film thickness of 15 nm, and the superlattice barrier layer 105 or 205 was formed by repeating an alternate lamination of these layers 20 times.

Table 3 shows a result obtained by conducting the characteristic evaluation of such light-emitting devices. The result of Comparative Example is also shown as reference.

TABLE 3

|  | VF@20 mA[V] | PO@20 mA[mW] |
|---|---|---|
| Example 5 | 2.08 | 3.71 |
| Example 6 | 2.06 | 3.79 |
| Comparative Example | 2.04 | 3.48 |

Like Examples 1 and 2, it was confirmed that VFs are not greatly different from that in Comparative Example and Examples 5 and 6 likewise have increased optical outputs (PO).

It is to be noted that the present invention is not restricted to the foregoing embodiments. The foregoing embodiments are just illustrations, and any examples that have substantially same configurations and exercise the same functions and effects as the technical concept described in claims of the present invention are included in the technical scope of the present invention.

The invention claimed is:

1. A light-emitting device manufactured with use of a compound semiconductor substrate comprising at least: a p-type cladding layer; a multiple-active layer portion in which three or more active layers made of $(Al_xGa_{1-x})_yIn_{1-y}P$ ($0 \leq x \leq 0.6$, $0.4 \leq y \leq 0.6$) and two or more barrier layers having a higher Al content rate x than the active layers are alternately laminated; and an n-type cladding layer, wherein the barrier layer on a side close to the p-type cladding layer has a smaller band gap than that of the barrier layer on a side close to the n-type cladding layer in the barrier layer, and the compound semiconductor substrate has a superlattice barrier layer between the multiple-active layer portion and the n-type cladding layer or in the n-type cladding layer.

2. The light-emitting device according to claim 1,
wherein the superlattice barrier layer is made of $(Al_xGa_{1-x})_yIn_{1-y}P$ ($0 \leq x \leq 1$, $0.4 \leq y \leq 0.6$) and/or $Al_zGa_{1-z}As$ ($0 \leq z \leq 1$) and obtained by alternately laminating sublayers having different band gaps such that one of the sublayers has a different band gap from that of a sublayer adjacent to the one of the sublayers.

3. The light-emitting device according to claim 1,
wherein the superlattice barrier layer is obtained by alternately laminating sublayers having different band gaps and having thicknesses of 15 nm or less such that one of the sublayers has a different band gap from that of a sublayer adjacent to the one of the sublayers.

4. The light-emitting device according to claim 2,
wherein the superlattice barrier layer is obtained by alternately laminating sublayers having different band gaps and having thicknesses of 15 nm or less such that one of the sublayers has a different band gap from that of a sublayer adjacent to the one of the sublayers.

5. The light-emitting device according to claim 1,
wherein the superlattice barrier layer is formed so as to be adjacent to the multiple-active layer portion.

6. The light-emitting device according to claim 2,
wherein the superlattice barrier layer is formed so as to be adjacent to the multiple-active layer portion.

7. The light-emitting device according to claim 3,
wherein the superlattice barrier layer is formed so as to be adjacent to the multiple-active layer portion.

8. The light-emitting device according to claim 4,
wherein the superlattice barrier layer is formed so as to be adjacent to the multiple-active layer portion.

* * * * *